United States Patent [19]

Aramoto et al.

[11] Patent Number: 5,538,903
[45] Date of Patent: Jul. 23, 1996

[54] METHOD OF MANUFACTURING SOLAR CELL

[75] Inventors: Tetsuya Aramoto, Osaka; Nobuo Nakayama, Hirakata; Kuniyoshi Omura, Higashiosaka; Mikio Murozono, Hirakata, all of Japan

[73] Assignee: Matsushita Electric Industrial Co., Ltd., Osaka, Japan

[21] Appl. No.: 342,445

[22] Filed: Nov. 18, 1994

[30] Foreign Application Priority Data

Nov. 18, 1993 [JP] Japan .................... 5-314478

[51] Int. Cl.⁶ .................................... H01L 31/18
[52] U.S. Cl. .................. 437/5; 136/260; 136/264; 136/265; 427/74; 427/76; 427/346; 437/9; 437/234
[58] Field of Search .................... 437/5, 9, 234; 427/74–76, 346; 136/260, 264, 265

[56] References Cited

FOREIGN PATENT DOCUMENTS

| 47-5880 | 3/1972 | Japan . | |
| 48-26976 | 8/1973 | Japan | 437/9 |
| 60-33278 | 2/1985 | Japan . | |
| 62-30318 | 2/1987 | Japan | 437/9 |
| 1-235116 | 9/1989 | Japan | 437/9 |
| 4-188623 | 7/1992 | Japan . | |
| 5-154441 | 6/1993 | Japan . | |

OTHER PUBLICATIONS

"Matsushita News", Feb. 1, 1983, pp. 1–5.
T. Arita et al, *Solar Energy Materials*, vol. 23, pp. 371–379 (Dec. 1991).

*Primary Examiner*—Aaron Weisstuch
*Attorney, Agent, or Firm*—Ratner & Prestia

[57] ABSTRACT

A method of manufacturing a solar cell, comprising the steps of forming a layer of n-type compound semiconductor, a layer of p-type compound semiconductor, and an electrode layer on a glass substrate, wherein at least one of said steps of forming a layer of compound semiconductor layer comprises preparing a paste by mixing a semiconductor raw material and a viscous agent, applying said paste to said substrate, drying said paste to harden it, and firing the dried paste, and vibrating said substrate during or after the application of the paste, to remove the bubbles in the paste, resulting in a semiconductor layer which is smooth, dense, and having good adhesion, thus realizing a solar cell with improved and uniform characteristics.

24 Claims, 3 Drawing Sheets

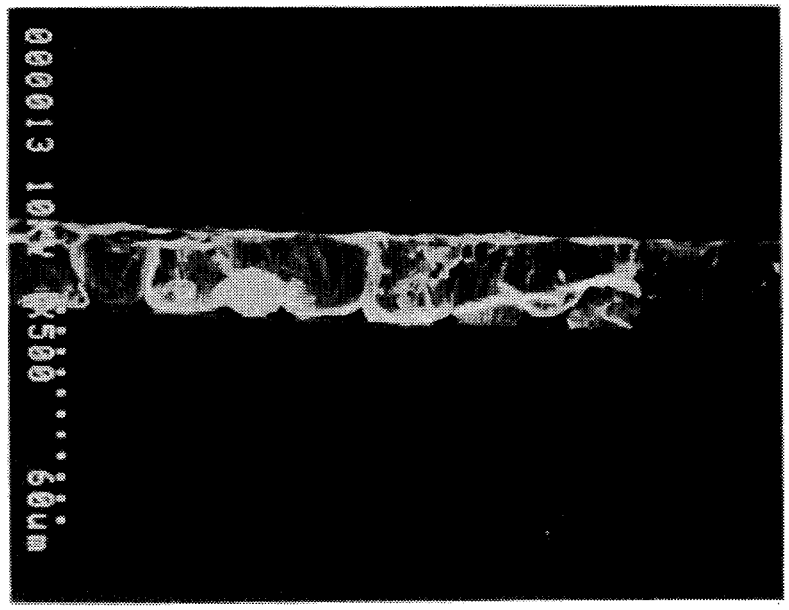
FIG. 2A X500
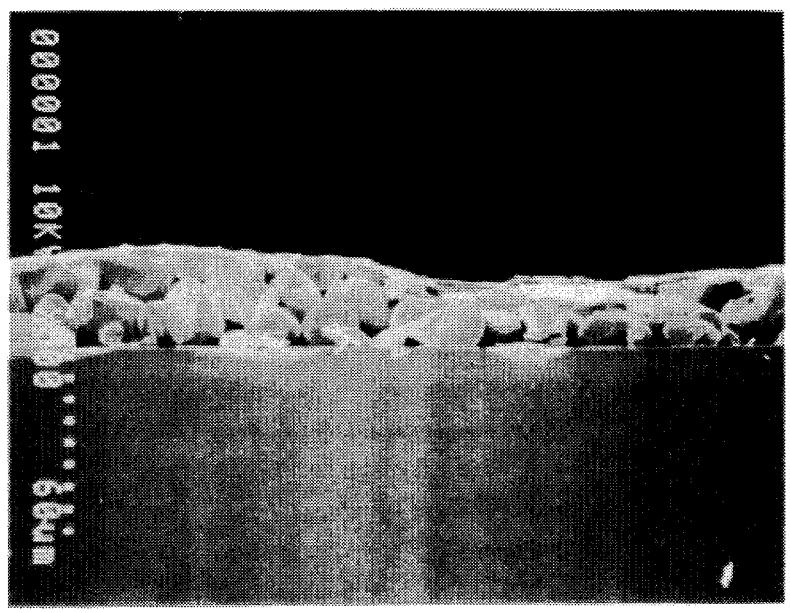
FIG. 2B X500

METHOD OF MANUFACTURING SOLAR CELL

BACKGROUND OF THE INVENTION

1. Field of the Invention

This invention relates to a method of manufacturing a solar cell of compound semiconductors by way of coating and firing.

2. Description of the Prior Art

In recent years, expectations for solar cells as a clean energy source have been raised, in view of the global warming, acid rain, ozone layer destruction, and other such environmental destruction. For the wide usage of solar cells to occur, improvement of the photo-electric conversion efficiency and reduction of the cost are most important. that purpose, solar cells made of compound semiconductors of Group III–V materials such as GaAs, InP, Group II–VI materials such as $CdS/Cu_2S$, CdS/CdTe, and Group I–II-I–VI$_2$ materials such as $CuInS_2$, $CuInSe_2$, as well as crystalline and amorphous silicon solar cells, have been investigated in many countries of the world. Among these, solar cells made of compound semiconductor heterojunctions of n-CdS/p-CdTe have been produced commercially, with relatively low material cost, conversion efficiency as high as 10%, less deterioration over long time periods, and a relatively simple manufacturing process suitable for mass production consisting of printing, drying, firing (sintering or baking), resulting in a high density arrangement on a glass plate and realization of high voltage without outer wire connection, as well as large area cells.

A typical solar cell of Group II–VI semiconductor, of which a sectional view is shown in FIG. 1, comprises a glass substrate 1 of high light transmittance and electrical insulation provided on one surface thereof with an n-type CdS layer 2, a p-type CdTe layer 3, a current collecting carbon electrode layer 4, an Ag.In electrode which is the positive terminal 5, and an Ag.In electrode which is the negative terminal 6 formed by laminating with printing and baking of each layer. Usually, although not shown in the figure, the thus prepared solar cell element is provided, on both the Ag-In electrodes, with a copper paste layer deposited, dried, and baked for easy soldering of lead wires. The cell is then covered all over with a passivation layer of a thermosetting resin such as epoxy and baked.

Light, including that of the sun, falls on the surface of the glass substrate 1 opposite to the surface having the above solar cell element layers, to generate electrical power by photo-electric conversion.

As the substrate, a heat-resistant barium borosilicate glass is employed, which has very low alkali metal content and a high softening point.

In the manufacturing of the compound semiconductor solar cell by the coating and firing method, it is important that each of the n-type compound semiconductor layer, p-type compound semiconductor layer, and electrode layer have uniform thickness, a smooth surface, and no pin-holes. Especially, if the n-type CdS semiconductor layer formed directly on the substrate is uniform, smooth, and non-porous, the adherence of the layer to the substrate is improved, resulting in an increase of the light transmittance, decrease of the sheet resistance, and, further, an increase of the photo-current and improvement of the characteristics of the cell.

Conventionally, to obtain such a layer, a paste made of the powdered compound semiconductor or elements therefor, an eletroconducting agent, and a viscous agent mixed together was kept under reduced pressure to remove bubbles therein and, after the deposition, the substrate was held horizontally at about 50° C., which was lower than the drying temperature of the viscous agent, to reduce the viscosity of the viscous agent and uniformly precipitate the raw material powders in order to obtain a high density layer. However, if the bubbles were removed from the paste before coating, it sometimes happened in the coating process by screen printing that bubbles were introduced from the surrounding atmosphere, resulting in uneven deposition or pin-holes. Also, with the heat treatment only after coating, the raw material powders did not always uniformly precipitate, and the bubbles were not sufficiently removed, resulting in the layer not being flat, or of uniform thickness. The pin-holes left after coating and firing of the layers caused an increase of the sheet resistance. Especially, if pin-holes were formed in the p-type CdTe layer, the carbon particles of the carbon electrode layer formed thereon penetrated into the pin-holes up to the CdS layer under the CdTe layer, causing internal short circuiting or current leakage, fatally damaging the solar cell performance.

SUMMARY OF THE INVENTION

It is an object of the present invention to provide a new method of manufacturing compound semiconductor solar cells comprising n-type and p-type compound semiconductors and electrode layers having improved performance, uniform characteristics, and low production cost, brought about by formation of the layers without pin-holes and with uniform thicknesses and smooth surfaces.

To obtain the above object, a method of manufacturing a solar cell according to the present invention comprises the steps of forming a layer of an n-type compound semiconductor, a layer of a p-type compound semiconductor, and an electrode layer on a glass substrate, wherein at least one of said steps of forming a layer of compound semiconductor comprises preparing a paste by mixing a semiconductor raw material and a viscous agent, applying said paste to said substrate, drying said paste to harden it, and firing said dried paste, and vibrating said substrate during or after the application of the paste.

BRIEF DESCRIPTION OF THE DRAWINGS

FIGS. 2(A)–2(B) are microphotographs of sections of sintered CdS layers on a glass substrate.

DETAILED DESCRIPTION OF THE INVENTION

Figure 1:
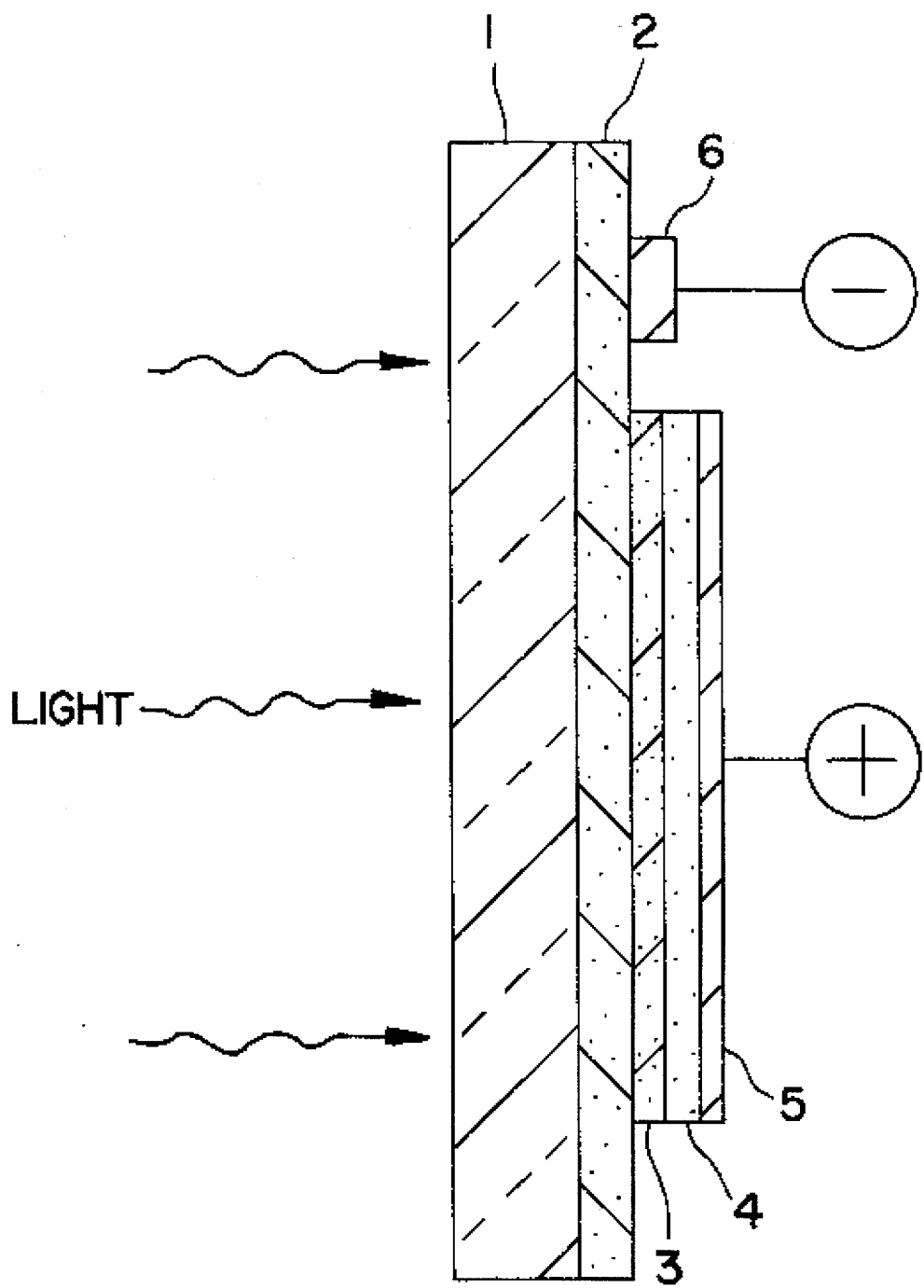
FIG. 1 is a schematic sectional view of a Group II–VI compound semiconductor solar cell of n-CdS/p-CdTe type.
Figure 3A:
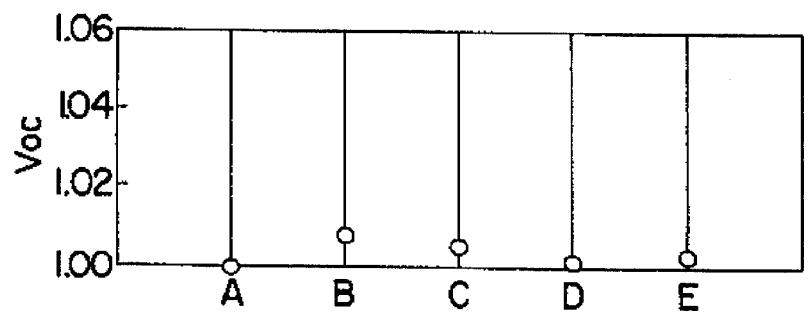
FIGS. 3A–3D are graphs of the open circuit voltages, short circuit currents, fill factors, and intrinsic photoelectric conversion efficiencies of solar cells fabricated according to the present invention, as well as by the conventional method.
Figure 3B:
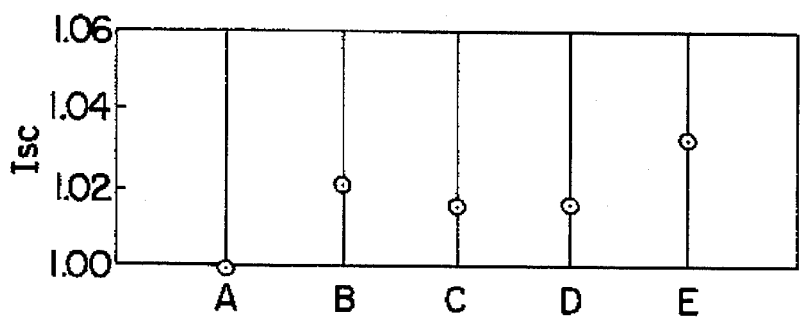
Figure 3C:
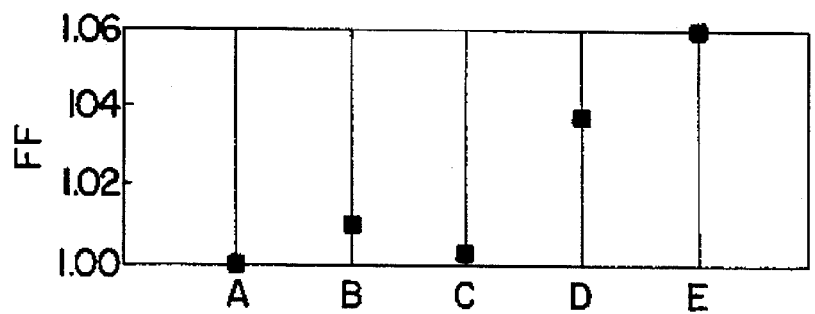
Figure 3D:
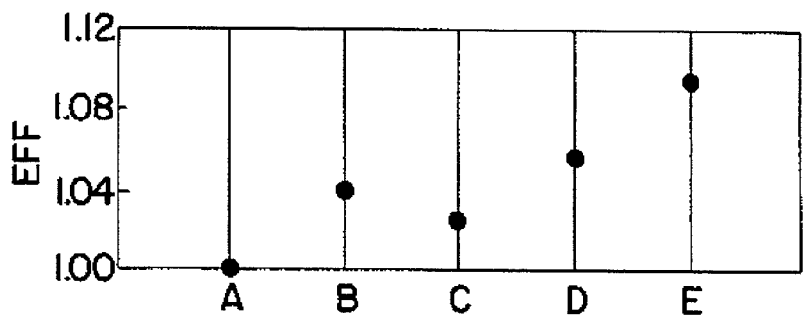

An example of the method of manufacturing a Group II–VI compound semiconductor solar cell according to the present invention is now explained by referring to FIG. 1.

A paste was prepared by mixing a fine powder of cadmium sulphide (CdS), cadmium chloride ($CdCl_2$), and propylene glycol (PG), the $CdCl_2$ being a flux, and the PG being a viscous agent.

The paste was applied to a substrate of barium borosilicate glass by screen printing to form a coating layer of 60 μm thickness.

The glass substrate was subjected to vibration of 20 μm amplitude and 28 kHz ultrasonic frequency by contacting the output end of a piezoelectric vibrator on the outer end of the substrate for 5 seconds, whereby the roughness of the deposited layer due to the screen net disappeared and the bubbles in the layer were removed. The substrate with the vibrated layer was then dried in the atmosphere at 120° C. (PG was removed by vaporization), and sintered at 690° C.

A comparison substrate coated with a CdS layer was fabricated by a similar method but without the application of vibration.

The light transmittance and sheet resistance of the two kinds of samples were then measured and microphotographs of sections thereof (×500) were taken. The results are shown in Table 1 and FIGS. 2(A)–2(B).

TABLE 1

| | CdS layer formed according to the present invention | CdS layer formed without vibration |
|---|---|---|
| Light transmittance (%) ($\lambda = 0.7$ μm) | 63 | 60 |
| Sheet resistance ($\Omega/cm^2$) | 28 | 33 |

As is observed in FIG. 2(B), the CdS layer on the substrate prepared without vibration has projections and depressions on the surface, void spaces and/or pin-holes, and the thickness is not uniform. Moreover, it is not sufficiently adherent to the substrate. On the contrary, the CdS layer of the sample shown in FIG. 2(A) fabricated with vibration has few voids and/or pin-holes, uniform thickness, and a smooth surface, fully adherent to the substrate. Numerically, Table 1 indicates improvements of the light transmittance by 5% and reduction of the sheet resistance by 15%. Thus it is expected the CdS layer formed with the vibration would have superior characteristics as the window layer of a solar cell.

Next, Cd.Te paste was prepared by kneading well an equi-mol mixture of cadmium (Cd) and tellurium (Te) powders with addition of $CdCl_2$ and PG, and the paste was applied in a 30 μm thickness on the above CdS sintered layer by screen printing, dried in the atmosphere, and sintered at 620° C., to form a CdTe layer.

Then, a carbon paste, prepared by kneading carbon powder and a viscous agent made of a solution of a resin in an organic solvent was applied on the CdTe layer, to form an electricity collecting electrode 4 on the n-CdS/p-CdTe heterojunction.

Further, the carbon electrode layer 4 and the CdS layer 2 were provided with a positive terminal 5 and a negative terminal 6 of Ag.In by depositing Ag.In paste by screen printing and drying and baking, the Ag.In paste being prepared by kneading of silver (Ag) and indium (In) powders with a viscous agent made of a solution of a resin in an organic solvent.

On the positive and negative electrodes 6 and 5 of Ag.In, copper paste was applied by screen printing, and dried and baked. Further, on the other parts of the cell a passivation layer was likewise applied by printing, and dried and baked, to complete the cell. The sinterings or bakings in the above processes were made in a nitrogen atmosphere.

The following describes the effect of vibration given to the glass substrate when, in the above described manufacturing process of a compound semiconductor solar cell, the pastes made of the mixtures of the respective powdered n-type and p-type compound semiconductor materials, flux agent, and viscous agent were applied to form the n-type and p-type layers and electrode layers on the substrate.

A: A sample cell fabricated with the semiconductor and electrode layers dried and fired after the application of the paste on the substrate without vibration, i.e. according to the prior art.

B: A sample cell fabricated with vibration given to the substrate only after the application of CdS paste, i.e. no vibration during the other processes.

C: A sample cell fabricated with vibration given only after the application of CdTe, i.e. no vibration during the other processes.

D: A sample cell fabricated with vibration given only after the application of the carbon paste, i.e. no vibration during the other processes.

E: A sample cell prepared with vibration given to the substrate after application of the CdS paste, CdTe paste, and carbon paste, with further drying and firing.

The vibration was given at 20 μm amplitude and 22 kHz frequency for 10 seconds by contacting the output end of the ultrasonic oscillator to the reverse side of the glass substrate; the reverse side being the surface on which the semiconductor layers were not applied. The other conditions were the same.

For the solar cells of these samples, the open circuit voltage (Voc), short circuit current (Isc), fill factor (FF), and intrinsic photo-electric conversion efficiency (EFF) were measured, with the results shown in FIGS. 3A–3D as values relative to the values for sample cell A taken as 1.00.

From the measurements of the sample cell B as shown in FIGS. 3A–3D, it is seen that the vibration after the CdS application has caused, by removing the paste bubbles, smoothing the film surface, and by improvement of the adhesion between the CdS layer and the substrate, resulting in an increase in light transmittance, and a reduction in surface resistance, an improvement of Isc, and, through the reduction of the number of pin-holes at the junction, improvements of Voc and FF.

From the data for the sample cell C, it is seen that the vibration after the Cd. Te paste application has led to the improvement of Voc, Isc, and FF as a result of CdTe grain size or orientation or other improvement in the film quality.

The measurements of the sample cell D show the contribution of the vibration after the carbon paste application to the improvement of Isc, FF, and EFF. It is thought that the contact resistance between the carbon electrode layer and the CdTe layer is reduced by the vibration.

Lastly, from the data of the sample cell E, it is clear that an about 10% increase of EFF compared to sample cell A has been obtained by the combined effect of the vibrations after each of the applications of CdS, Cd.Te, and carbon pastes.

Thus, it is understood that the characteristics of the solar cells are improved by the simple measure of vibrating the glass substrate after the applications of the pastes, without requiring any significant change of the process or manufacturing installation.

The method of application of the various pastes is not confined to the screen printing as referred to in the above examples. Various other methods can be employed; nozzle printing of paste from a nozzle, including printing of a figure in a desired pattern on a glass substrate by adjusting the distance between the tip of the nozzle and the surface of the substrate to change the paint thickness; relief and intaglio printing; and spray printing of paste with a spray gun while shielding the non-printed areas by a mask.

Table 2 shows how the spread of unevenness of the surface (the difference between the maximum thickness and the minimum thickness) and the yields in production change depending upon whether or not the ultrasonic treatment is employed on every layer of the cells. As is observed, by the vibration after the paste application similar effects can be obtained as with the screen printing.

TABLE 2

| Printing | Without ultrasonic treatment | | With ultrasonic treatment | |
|---|---|---|---|---|
| | Spread of unevenness (μm) | Yield (%) | Spread of unevenness (μm) | Yield (%) |
| Screen | 35 | 92 | 8 | 95 |
| Nozzle | 15 | 85 | 9 | 89 |
| Relief | 21 | 72 | 4 | 82 |
| Intaglio | 26 | 82 | 9 | 90 |
| Spray | 18 | 74 | 12 | 91 |

Instead of vibrating the outer circumference or the outer surface after the application of the pastes as explained above, vibration during printing of the paste may have the same effects.

For the application of such ultrasonic vibration, 5 to 10 seconds are sufficient, so that the application of paste with the vibration and further vibration thereafter of a short time less than 5 seconds is sufficient; therefore substantial elongation of manufacturing time does not occur.

Although ultrasonic vibration given to the glass substrate during or after the pastes of the n-type and p-type compound semiconductor layers and electrode layer were applied was effective, vibration given during or after application of the pastes for the formation of the terminal or passivation layer did not bring about remarkable effects on the cell characteristics.

It is added that the method of the present invention, thus far explained with reference to CdS/CdTe compound semiconductor solar cells, can be applied to the formation of other compound semiconductor layers of solar cells including Group I–III–VI$_2$ compounds, for example CuInSe$_2$, in the place of CdTe, provided the layer is formed by coating and firing.

As explained above in detail, when a solar cell is fabricated by forming a laminate of n-type and p-type compound semiconductor layers and electrode layers on a glass substrate, the layers become free of bubbles, and the surfaces flat, if vibration is given to the glass substrate during or after the paste of the raw material and viscous agent for the layer are applied; and drying and firing thereafter provide dense layers of uniform thickness and in good contact with the next layer, and a solar cell with improved, uniform characteristics.

What is claimed:

1. A method of manufacturing a solar cell, comprising the steps of forming a layer of n-type compound semiconductor, a layer of p-type compound semiconductor, and an electrode layer on a glass substrate, wherein at least one of said steps of forming a layer of compound semiconductor comprises:

preparing a paste by mixing a powdered semiconductor raw material and a viscous agent, applying said paste to said substrate, drying said paste to harden it, and firing said paste, and vibrating said substrate during or after the application of the paste.

2. A method of manufacturing a solar cell according to claim 1, wherein said vibration is of an ultrasonic pulse form.

3. A method of manufacturing a solar cell according to claim 2, wherein the application of the paste is performed by a method selected from the group consisting of screen printing, nozzle printing, relief printing, intaglio printing, and spray printing.

4. A method of manufacturing a solar cell according to claim 3, wherein the powdered raw materials for the layers of n-type and p-type semiconductors comprise elements of groups II and VI or a compound thereof.

5. A method of manufacturing a solar cell according to claim 4, further comprising a step of forming a passivation layer of resin over said cell except for the positive and negative output terminals thereof.

6. A method of manufacturing a solar cell according to claim 3, wherein said n-type compound semiconductor layer comprises CdS, and said p-type compound semiconductor layer comprises one of CdTe and CuInSe$_2$.

7. A method of manufacturing a solar cell according to claim 6, further comprising a step of forming a passivation layer of resin over said cell except for the positive and negative output terminals thereof.

8. A method of manufacturing a solar cell according to claim 3, further comprising a step of forming a passivation layer of resin over said cell except for the positive and negative output terminals thereof.

9. A method of manufacturing a solar cell according to claim 2; wherein the powdered raw materials for the layers of n-type and p-type semiconductors comprise elements of groups II and VI or a compound thereof.

10. A method of manufacturing a solar cell according to claim 9, further comprising a step of forming a passivation layer of resin over said cell except for the positive and negative output terminals thereof.

11. A method of manufacturing a solar cell according to claim 2, wherein said n-type compound semiconductor layer comprises CdS, and said p-type compound semiconductor layer comprises one of CdTe and CuInSe$_2$.

12. A method of manufacturing a solar cell according to claim 11, further comprising a step of forming a passivation layer of resin over said cell except for the positive and negative output terminals thereof.

13. A method of manufacturing a solar cell according to claim 2, further comprising a step of forming a passivation layer of resin over said cell except for the positive and negative output terminals thereof.

14. A method of manufacturing a solar cell according to claim 1, wherein the application of the paste is performed by a method selected from the group consisting of screen printing, nozzle printing, relief printing, intaglio printing, and spray printing.

15. A method of manufacturing a solar cell according to claim 14, wherein the powdered raw materials for the layers of n-type and p-type semiconductors comprise elements of groups II and VI or a compound thereof.

16. A method of manufacturing a solar cell according to claim 15, further comprising a step of forming a passivation layer of resin over said cell except for the positive and negative output terminals thereof.

17. A method of manufacturing a solar cell according to claim 14, wherein said n-type compound semiconductor layer comprises CdS, and said p-type compound semiconductor layer comprises one of CdTe and CuInSe$_2$.

18. A method of manufacturing a solar cell according to claim 17, further comprising a step of forming a passivation layer of resin over said cell except for the positive and negative output terminals thereof.

19. A method of manufacturing a solar cell according to claim 14, further comprising a step of forming a passivation layer of resin over said cell except for the positive and negative output terminals thereof.

20. A method of manufacturing a solar cell according to claim 1, wherein the powdered raw materials for the layers of n-type and p-type semiconductors comprise elements of groups II and VI or a compound thereof.

21. A method of manufacturing a solar cell according to claim 20, further comprising a step of forming a passivation layer of resin over said cell except for the positive and negative output terminals thereof.

22. A method a manufacturing a solar cell according to claim 1, wherein said n-type compound semiconductor layer comprises CdS, and said p-type compound semiconductor layer comprises one of CdTe and $CuInSe_2$.

23. A method of manufacturing a solar cell according to claim 22, further comprising a step of forming a passivation layer of resin over said cell except for the positive and negative output terminals thereof.

24. A method of manufacturing a solar cell according to claim 1, further comprising a step of forming a passivation layer of resin over said cell except for the positive and negative output terminals thereof.

* * * * *